United States Patent [19]

Furukawa et al.

[11] Patent Number: 4,977,569
[45] Date of Patent: Dec. 11, 1990

[54] INTEGRATED SEMICONDUCTOR LASER

[75] Inventors: Ryozo Furukawa; Keisuke Shinozaki; Toshiaki Fukunaga, all of Tokyo, Japan

[73] Assignee: Oki Electric Industry Co., Ltd., Tokyo, Japan

[21] Appl. No.: 382,294

[22] Filed: Jul. 20, 1989

[30] Foreign Application Priority Data

Jul. 22, 1988 [JP] Japan ................. 63-181552

[51] Int. Cl.⁵ .............................. H01S 3/19
[52] U.S. Cl. ........................ 372/50; 372/45; 372/46; 372/48
[58] Field of Search .............. 372/50, 48, 45, 46

[56] References Cited

U.S. PATENT DOCUMENTS

| | | | |
|---|---|---|---|
| 4,594,719 | 6/1986 | Ackley | 372/50 |
| 4,624,000 | 11/1986 | Streifer et al. | 372/45 |
| 4,641,311 | 2/1987 | Ackley | 372/48 |
| 4,751,709 | 6/1988 | Matsumoto et al. | 372/50 |
| 4,817,104 | 3/1989 | Taneya et al. | 372/48 |

FOREIGN PATENT DOCUMENTS 63-081996 12/1988 Japan .
WO8500076 3/1985 PCT Int'l Appl. .
2178233 4/1987 United Kingdom .

OTHER PUBLICATIONS

OQE86-61-81, Kenji Ikeda et al., vol. 86, No. 91, Jul. 15, 1986.
Patent Abstracts of Japan, vol. 10, No. 108 (E-398) [2165], 23rd Apr. 1986; & JP-A-60-245 190 (Sharp K.K.) *Whole Abstract*.
Patent Abstracts of Japan, vol. 12, No. 158 (E-608) [3005], 13th May 1988; & JP-A-62 271 486 (NEC Corp.) 25-11-1987 *Abstract*.
Applied Physics Letters, vol. 54, No. 26, Jun. 1989, pp. 2654-2655, *Whole Article*.

Primary Examiner—Georgia Epps
Attorney, Agent, or Firm—Wenderoth, Lind & Ponack

[57] ABSTRACT

An integrated phase-locked semiconductor laser wherein a plurality of waveguide paths extend in parallel to each other. A current blocking layer is formed on one of opposite major surfaces of a semiconductor substrate and is divided into a plurality of regions by a plurality of stripe-like channels. Each of the channels has a depth which reaches at least the above-mentioned major surface of the substrate. A first cladding layer covers the surface of the current blocking layer and those regions of the substrate which are exposed to the channels. A waveguide layer is deposited on the first cladding layer and has a surface opposite to the first cladding layer which is substantially flat. An active layer, a reflecting layer, a second cladding layer and a cap layer are deposited one upon another on the waveguide layer layer. The waveguide layer has an effective refractive index which sequentially decreases in the order of first regions individually associated with the plurality of channels, second regions individually associated with interchannel regions each intervening between nearby channels, and third regions located at opposite sides of the plurality of channels relatively to each other.

6 Claims, 6 Drawing Sheets

4,977,569

INTEGRATED SEMICONDUCTOR LASER

BACKGROUND OF THE INVENTION

1. Field of the Invention

The present invention relates to an integrated phase-locked semiconductor laser, or simply integrated laser, having a plurality of waveguide paths arranged side by side therein, and a method of fabricating the same.

2. Description of the Prior Art

A device implemented by a laser of the type described is disclosed by Ikeda et al. in a paper entitled "Fundamental Transverse Mode and Light Output of Integrated Phase-Locked Laser", Technical Studies Report OQE86-64, The Institute of Electronics and Communication Engineers of Japan (1986).

An integrated laser has been elaborated to meet the demand for a semiconductor laser whose output is higher than the maximum output of a semiconductor laser of the type having a single waveguide path. However, a problem with an integrated laser is that integrating a plurality of waveguide paths makes it far more difficult to produce a single-peak far-field image, compared to a single waveguide path. To eliminate this problem, it is necessary that the waveguide paths individually oscillate in a fundamental mode and in a fundamental supermode of the same phase. One approach heretofore proposed for satisfying this condition is a structure which increases the difference in gain between the fundamental supermode and higher harmonic supermodes. A basic structure of this kind is discussed in the previously mentioned paper.

Referring to FIG. 8 of the drawings, a specific configuration of the prior art integrated laser disclosed in the above-mentioned paper is shown in a sectional view. As shown, the prior art integrated laser has a p-type GaAs substrate 31, an n-type GaAs current blocking layer 32, a p-type $Al_{0.35}Ga_{0.65}As$ cladding layer 33, an $Al_{0.08}Ga_{0.92}As$ active layer 34, an n-type $Al_{0.35}Ga_{0.65}As$ cladding layer 35, and an n-type GaAs cap layer 36. The integrated laser shown in the figure is fabricated by sequentially depositing on the p-GaAs substrate 31 and n-GaAs current blocking layer 32 the p-$Al_{0.35}Ga_{0.65}As$ cladding layer 33, $Al_{0.08}Ga_{0.92}As$ active layer 34, n-$Al_{0.35}Ga_{0.65}As$ cladding layer 35 and n-GaAs cap layer 36 by liquid-phase epitaxial growth. In the resulting laser, the individual waveguide paths have effective (or equivalent) refractive indexes $n_{eff}$ which are distributed as shown in FIG. 9.

In FIG. 9, the portions where the effective refractive index $n_{eff}$ is high, i.e., the waveguide path portions have a width W, while the other portions where it is low have a width S. Different values are selected for the widths W and S to change the difference in effective refractive index dn to thereby render the gain of the fundamental supermode higher than the gains of the higher harmonic supermodes. This allows the laser to oscillate in the fundamental supermode of the same phase.

FIGS. 10A and 10B are plots each showing calculated values of the gains of supermodes which are associated with the prior art integrated laser. Specifically, the graph shown in FIG. 10A was obtained with an effective refractive index difference dn of 1 percent, a stripe width W of 4 microns, a width S of 1 micron as defined by nearby stripes, and five stripes, while the graph of FIG. 10B was derived from an effective refractive index difference dn of 0.05 percent, a stripe with of 2 microns, a width S of 2 microns, and ten stripes.

Decreasing the widths W and S and the effective refractive index difference dn is successful in increasing the difference in gain of the highest harmonic supermode ($\nu=5$ in the case of five stripes and $\nu=10$ in the case of nine stripes) from the gain of the fundamental supermode ($\nu=1$), as shown in FIG. 10B. This allows the transverse mode of the integrated laser to be controlled to the fundamental supermode, thereby implementing a single-peak far-field image. It is to be noted that, in FIG. 10B, the plat where $\nu=10$ is cut off and therefore may not be taken into account.

However, when an integrated laser is to be fabricated by liquid-phase epitaxial growth, it is difficult to reduce the widths W and S. A prerequisite with the fabrication of an integrated laser by liquid-phase epitaxial growth is that the widths W and S be increased for the purpose of insuring a high output and reducing the light output per unit area of an emitting end. For this reason, the widths W and S have heretofore been limited to 3 to 4 microns and 1 to 2 microns, respectively, by the etching adapted to form the channels and the meltback which occurs during the course of liquid-phase epitaxial growth.

SUMMARY OF THE INVENTION

It is therefore an object of the present invention to provide an integrated laser whose transverse mode can be controlled to the fundamental supermode within the range of design dimensions which can be readily implemented by liquid-phase epitaxial growth, thereby producing a desirable single-peak far-field image.

In accordance with the present invention, an integrated phase-locked semiconductor laser wherein a plurality of waveguide paths extend in parallel to each other includes a semiconductor substrate. A current blocking layer is formed on one of opposite major surfaces of the substrate and is divided into a plurality of regions by a plurality of stripe-like channels each having a lower end reaching at least the above-mentioned one major surface of the substrate. A first cladding layer covers the surface of the current blocking layer and those regions of the substrate which are exposed to the channels. A waveguide layer is formed on the first cladding layer and has a surface opposite to the first cladding layer which is substantially flat. An active layer is formed on the waveguide layer. A reflecting layer is formed on the active layer. A second cladding layer is formed on the reflecting layer. A cap layer is formed on the second cladding layer. The waveguide layer has an effective refractive index which sequentially descreases in the order of first regions individually associated with the plurality of channels, second regions individually associated with interchannel regions each intervening between nearby ones of the channels, and third regions located at opposite sides of the plurality of channels relatively to each other.

Also, in accordance with the present invention, a method of fabricating an integrated phase-locked semiconductor laser in which a plurality of waveguide paths extend in parallel to each other comprises the steps of preparing a semiconductor substrate; forming a current blocking layer on one of opposite major surfaces of the substrate; forming a plurality of parallel stripe-like channels in the current blocking layer to divide this layer into a plurality of regions, each of the plurality of channels having a bottom reaching at least the above-mentioned one major surface of the substrate; forming a first cladding layer by liquid-phase epitaxial growth in such a manner as to cover a surface of the current blocking layer and those regions of the substrate which are exposed to the channels; forming a waveguide layer, an active layer, a reflecting layer, a second cladding layer and a cap layer sequentially on the first cladding layer by liquid-phase epitaxial growth; and selecting, before growing the first cladding layer, a supersaturation degree of a solution for growing the first cladding layer so as to melt back those regions of the current blocking layer which correspond to interchannel regions each intervening between nearby ones of the channels, whereby first regions of the waveguide layer corresponding to the channels, second regions of the waveguide layer corresponding to the interchannel regions, and third regions of the waveguide layer corresponding to opposite regions which are located at opposite sides of the plurality of channels are sequentially thinned relatively to each other in this order, and a surface of the waveguide layer opposite to the first cladding layer is made substantially flat.

Further, in accordance with the present invention, a method of fabricating an integrated phase-locked semiconductor laser in which a plurality of waveguide paths extend in parallel to each other comprises the steps of preparing a semiconductor substrate; forming a current blocking layer, an antimeltback layer and a meltback layer sequentially in this order on one of opposite major surfaces of the substrate; forming a plurality of stripe-like parallel channels in the current blocking layer, antimeltback layer and meltback layer to divide the layers into a plurality of regions, each of the plurality of channels having a lower end reaching at least the one major surface of the substrate; melting back those regions of the meltback layer which correspond to regions each intervening between nearby ones of the channels; forming a first cladding layer by liquid-phase epitaxial growth in such a manner as to cover the surfaces of the antimeltback layer and meltback layer and those regions of the substrate which are exposed to the channels; and forming a waveguide layer, an active layer, a reflecting layer, a second cladding layer and a cap layer sequentially in this order on the first cladding layer by liquid-phase epitaxial growth, whereby the surface of the waveguide layer opposite to the first cladding layer is made substantially flat.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS -

Figure 1:
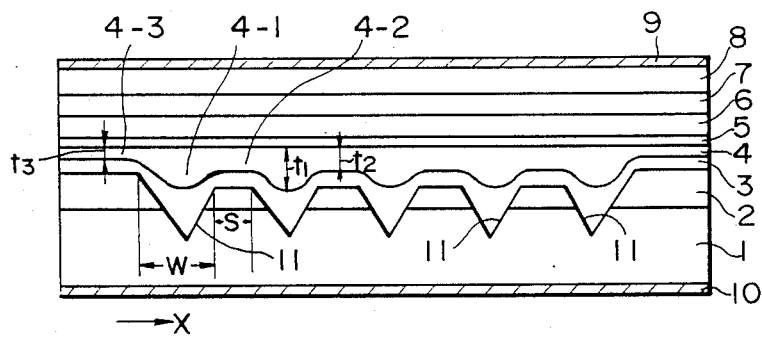
FIG. 1 is a section showing an integrated laser embodying the present invention.

Referring to FIG. 1 of the drawings, an integrated laser embodying the present invention is shown. As shown, the integrated laser has a p-type GaAs substrate 1, an n-type GaAs current blocking layer 2, a p-type $Al_{0.4}Ga_{0.6}As$ lower cladding layer 3, a p-channel $Al_{0.33}Ga_{0.67}As$ waveguide layer 4, a p-type or an n-type $Al_{0.08}Ga_{0.92}As$ active layer 5, an n-type $Al_{0.5}Ga_{0.5}As$ reflecting layer 6, an n-type $Al_{0.35}Ga_{0.65}As$ upper cladding layer 7, an n-type GaAs cap layer 8, an n-side ohmic electrode 9, and a p-side ohmic electrode 10.

Parallel stripe-like channels 11 are formed in the current blocking layer and substrate 1 in a direction perpendicular to the paper surface of FIG. 1. As viewed in the section, each channel 11 extends from the current blocking layer 2 down to the substrate 1. The lower cladding layer 3, waveguide layer 4, active layer 5, reflecting layer 6, upper cladding layer 7 and cap layer 8 are sequentially formed on the substrate 2 by liquid-phase eptiaxial growth. In the illustrative embodiment, the thickness of the waveguide layer 4 differs from one region to another. Specifically, the waveguide layer 4 has one thickness in its channel regions 4–1 which overlie the channels 11, another thickness in its interchannel regions 4–2 which overlie lands each intervening between nearby channels 11, and another thickness in its opposite end regions 4–3. Assuming that the above-mentioned regions 4–1, 4–2 and 4–3 have respectively thicknesses $t_1$, $t_2$ and $t_3$, there holds a relationship of $t_1 > t_2 > t_3$ in this particular embodiment.

Figure 2:
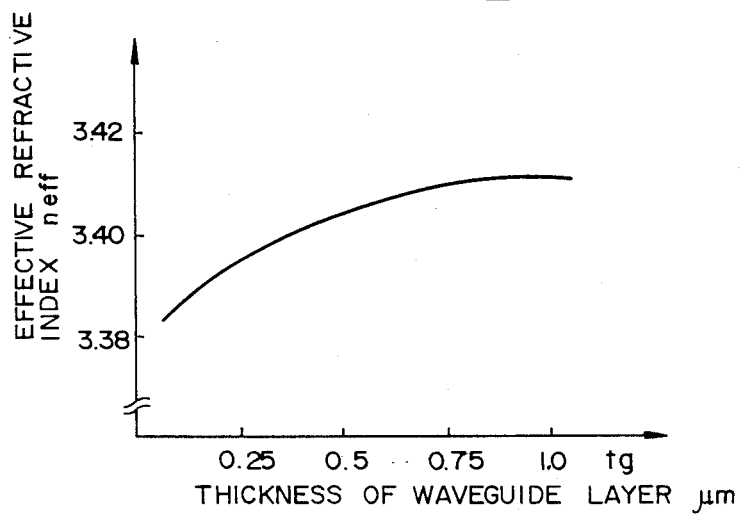
FIG. 2 is a graph representative of a relationship between the thickness of a waveguide layer included in the embodiment of FIG. 1 and the effective refractive index.
Figure 3:
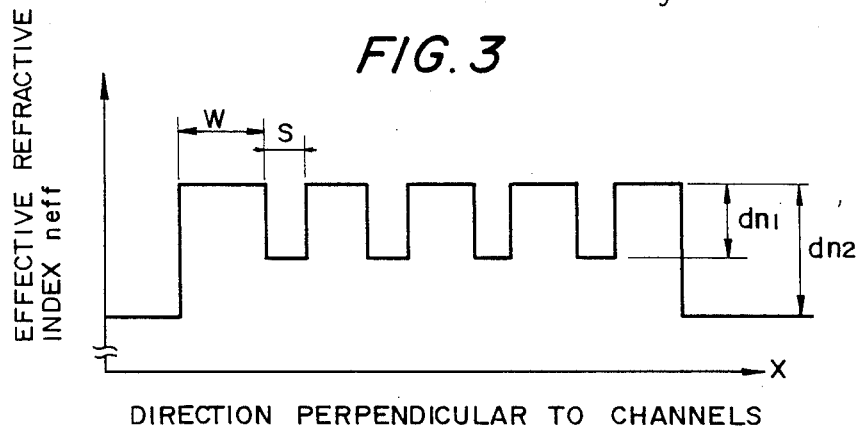
FIG. 3 plots an effective refractive index distribution particular to the embodiment.

FIG. 2 is a graph representative of a relationship between the thickness $t_g$ of the waveguide layer 4 and the effective refractive index $n_{eff}$ and which was determined with the active layer 5 having a thickness of 0.07 micron. As shown, the effective refractive index $n_{eff}$ is generally proportional to the thickness $t_g$ of the waveguide layer 4. Hence, when the waveguide layer 4 has a particular thickness distribution as represented by $t_1 > t_2 > t_3$, the effective or equivalent refraction index $n_{eff}$ of the active layer 5 as measured in the direction parallel to the layer 5 (i.e. perpendicular to the channels 11) is distributed with periodicity in a direction X, as shown in FIG. 3 schematically. In FIG. 3, the horizontal direction X corresponds to the direction perpendicular to the channels 11 as viewed in FIG. 1. It follows that the regions 4–1 of the waveguide layer 4 overlying the channels 11, i.e., the channel regions 4–1 show a higher effective refractive index profile than the regions 4–2 which overly the lands between the nearby channels 11, i.e., the interchannel regions 4–2. Assume that the difference in effective refractive index between the channel regions 4–1 and the interchannel regions 4–2 is $dn_1$, and that the difference in effective refractive index between the channel regions 4-1 and the opposite marginal regions 4-3 is $dn_2$.

Figure 4A:
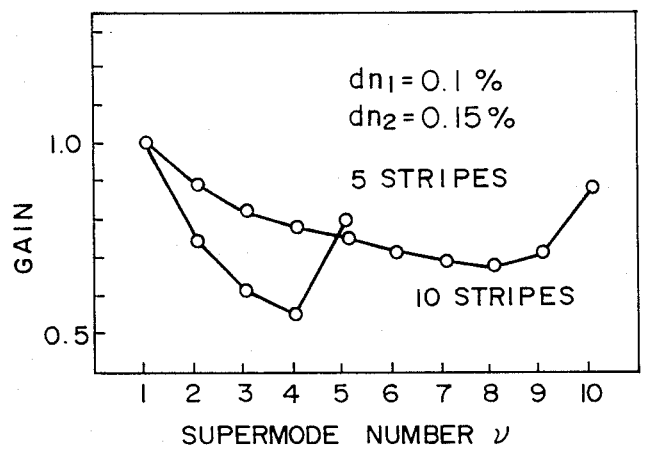
FIGS. 4A, 4B and 4C are graphs each plotting calculated values of the gains of the supermodes in specific conditions and associated with the embodiment.
Figure 4B:
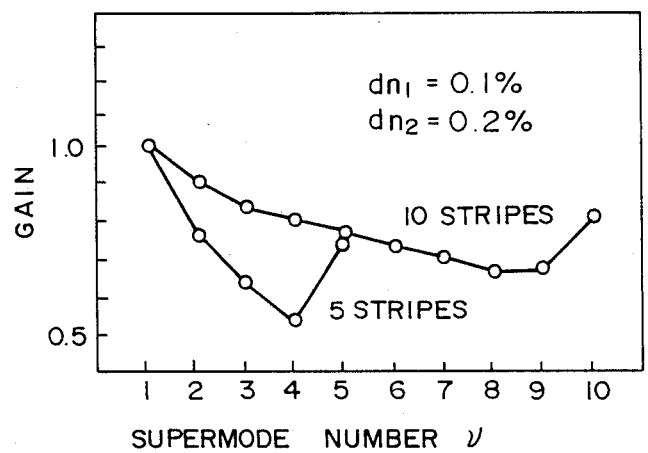
Figure 4C:
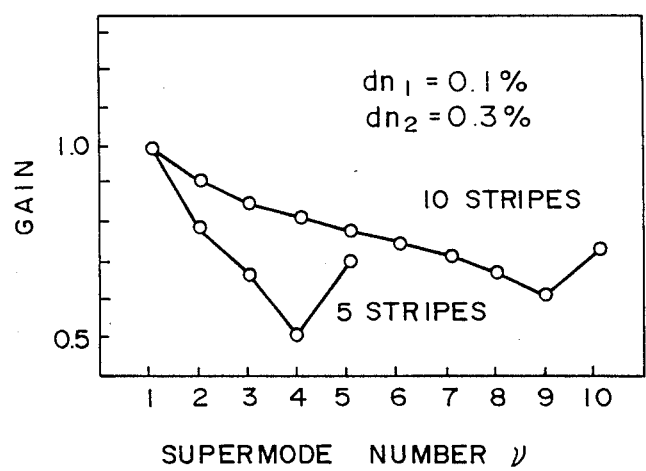

FIGS. 4A, 4B and 4C are plots representative of calculated values of the gains of the various supermodes. Specifically, the plot of FIG. 4A was produced with $dn_1$ of 0.1 percent, $dn_2$ of 0.15 percent and five stripes or channels, while the plots of FIGS. 4B and 4C were obtained with $dn_1$ of 1 percent, $dn_2$ of 0.15 percent and 0.30 percent, respectively, and ten stripes or channels. In the figures, the ordinate indicate the gains of supermodes relative to the gain of the fundamental supermode ($\nu=1$) which is 1 (one). The stripe width W and the width S between the stripes, FIG. 1, were respectively selected to be 3 microns and 1 micron which are readily achievable with liquid-phase epitaxial growth.

It will be seen from the above that the illustrative embodiment allows the difference between the gain of the fundamental supermode ($\nu=1$) and the gain of the highest harmonic supermode ($\nu=5$ for five stripes and $\nu=10$ for ten stripes) to be increased within the range of stripe widths W and S which can be easily implemented by liquid-phase epitaxial growth. With a greater difference between such gains, it is possible to control the transverse mode of an integrated laser to the fundamental supermode and thereby to achieve a single-peak far-field image.

Referring to FIGS. 5A through 5D, a specific sequence of steps for fabricating the integrated laser shown in FIG. 1 is illustrated. In the figures, identical layers and their regions as those shown in FIG. 1 are designated by the same reference numerals. In this example, the laser was so designed as to lase with a wavelength of 830 nanometers and to have a stripe width W of 4 microns and a stripe pitch of 5 microns, i.e., W=4 microns and S=1 micron. Under such dimensional conditions and assuming five stripes, whether or not a semiconductor laser having the structure shown in FIG. 1 is attainable depends on the conditions for the liquid-phase epitaxial growth of the p-type lower cladding layer 4.

Figure 5A:
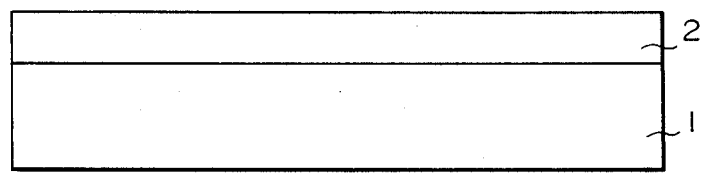
FIGS. 5A, 5B, 5C and 5D are sections demonstrating a sequence of steps for fabricating the device shown in FIG. 1.
Figure 5B:
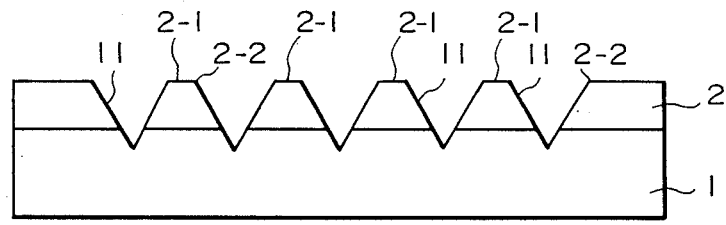
Figure 5C:
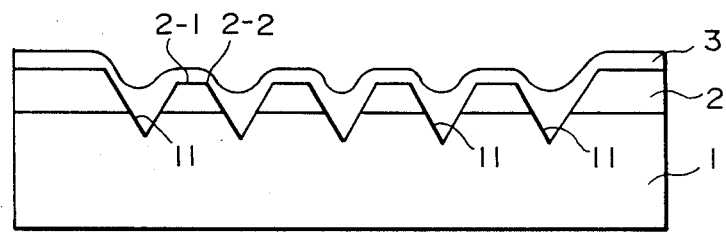
Figure 5D:
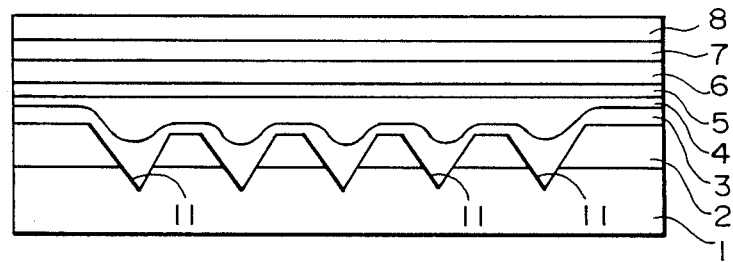

As shown in FIG. 5A, a p-type GaAs substrate 1 is prepared. An n-type GaAs current blocking layer 2 is grown on the GaAs substrate 1 to a uniform thickness of 1 micron, for example. Then, as shown in FIG. 5B, stripes or generally V-shaped channels 11 are formed in the substrate 1 and current blocking layer 2 by photolithographic etching technology, uncovering the substrate 1 in the channels 11. This is followed by meltetching the portions 2-1 of the current locking layer 2 each intervening between nearby channels 11 to a thickness of 0.3 to 0.5 micron, by using a solution which is adapted to grow a p-type $Al_{0.4}Ga_{0.6}As$ lower cladding layer 3. Subsequently, as shown in FIG. 5C, the lower cladding layer 3 is grown on the laminate. A p-type $Al_{0.33}Ga_{0.67}As$ waveguide layer 4, FIG. 5D, is grown on the lower cladding layer 3.

For the above growing procedure, there may be selected a growth temperature of 800 degrees centigrade, a solution having an supersaturation degree of 3 to 5 degrees centigrade, and a supercooling method which uses a cooling speed of 0.5 degree centigrade per minute.

In general, in FIGS. 5B and 5C, the expitaxial growth proceeds at a higher rate in the channel 11 regions than in the flat region while angles are easy to melt back. Hence, when the solution used has the above-mentioned supersaturation degree, the growth occurs at an extremely high rate in the channel portions while shoulder portions 2—2 of the current blocking layer 2 are melt back, in an initial stage of growth. As a result, the regions of the current blocking layer 2 each intervening between nearby channels or stripes 11 can be meltetched by 0.3 micron to 0.5 micron. This allows the waveguide layer 4 to be grown on the lower cladding layer 3 so that an active layer 5 may be deposited flat on the waveguide layer 4.

The growth of the lower cladding layer 3 is followed by the sequential growth of a p-type $Al_{0.33}Ga_{0.67}As$ waveguide layer 4, an $Al_{0.88}Ga_{0.92}As$ active layer, an n-type $Al_{0.05}Ga_{0.5}As$ reflecting layer 6, an n-type $Al_{0.35}Ga_{0.65}As$ upper cladding layer 7, and an n-type GaAs cap layer 8. The resulting laminate structure is shown in FIG. 5D. Subsequently, as shown in FIG. 1, an n-side ohmic electrode 9 and a p-side ohmic electrode 10 are formed on the upper surface of the cap layer 8 and the lower surface of the substrate 1, respectively, completing the integrated semiconductor laser.

As stated above, in the illustrative embodiment, the regions 2-1 of the current blocking layer 2 each intervening between the channels 11 are melt back by 0.3 micron to 0.5 micron to provide the waveguide layer 4 with thicknesses $t_1$, $t_2$ and $t_3$ which are 1.0 micron to 0.8 micron, 0.6 micron, and 0.4 micron, respectively. Therefore, the effective refractive index differences $dn_1$ and $dn_2$ as defined in FIG. 3 can be controlled to 0.1 percent or less and 0.2 percent to 0.3 percent, respectively.

Figure 6:
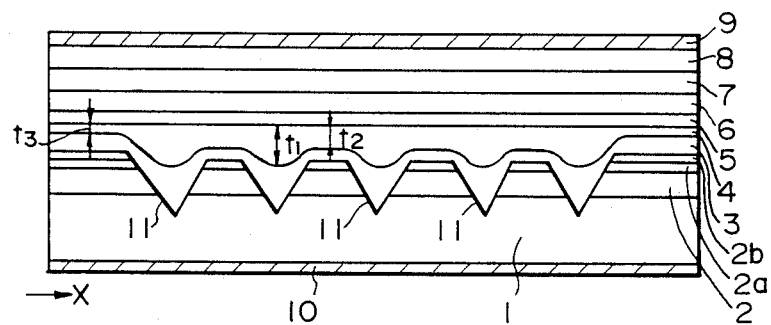
FIG. 6 is a section showing an alternative embodiment of the integrated laser in accordance with the present invention.
Figure 7A:
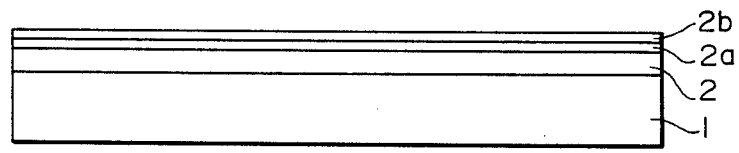
FIGS. 7A, 7B and 7C are sections showing how the device shown in FIG. 6 is fabricated.
Figure 7B:
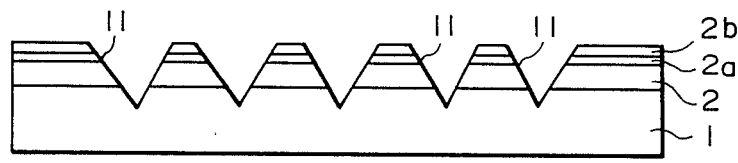
Figure 7C:
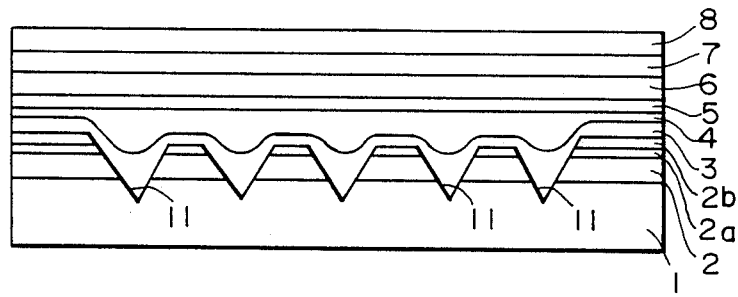
Figure 8:
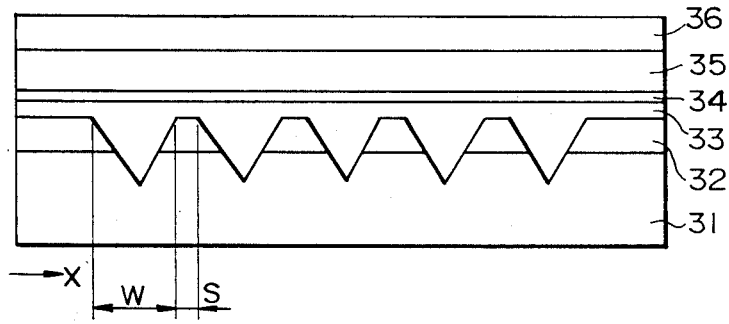
FIG. 8 is a section showing a prior art integrated laser.
Figure 9:
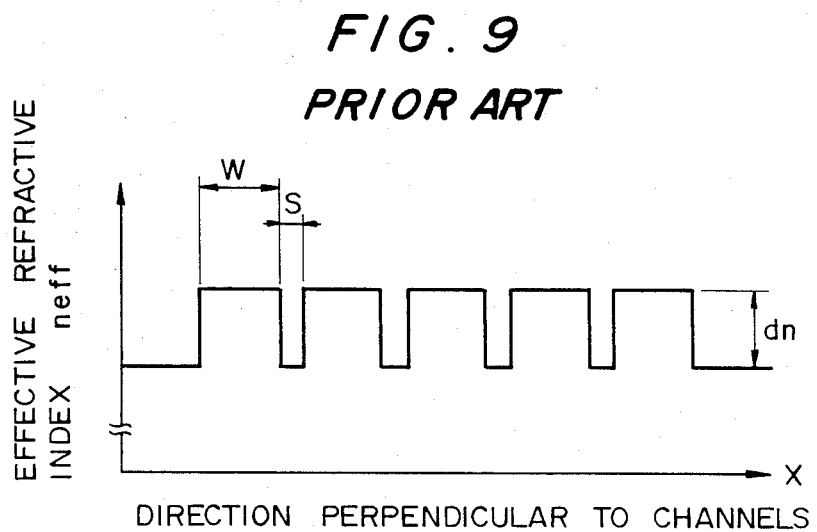
FIG. 9 plots an effective refractive index distribution of the prior art integrated laser.
Figure 10A:
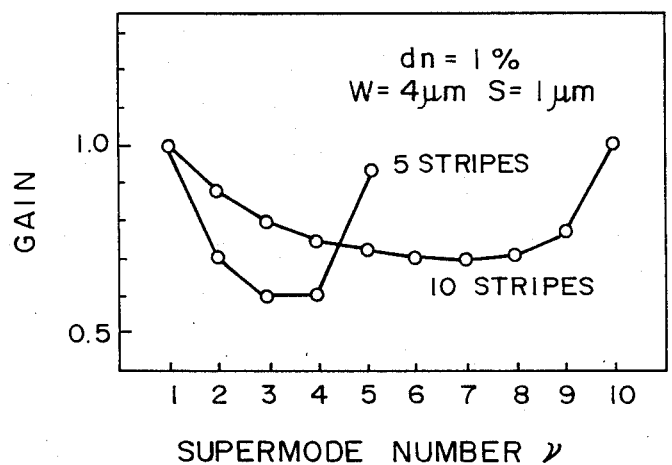
FIGS. 10A and 10B are graphs each plotting the calculated values of the supermodes under specific conditions and associated with the prior art integrated laser.
Figure 10B:
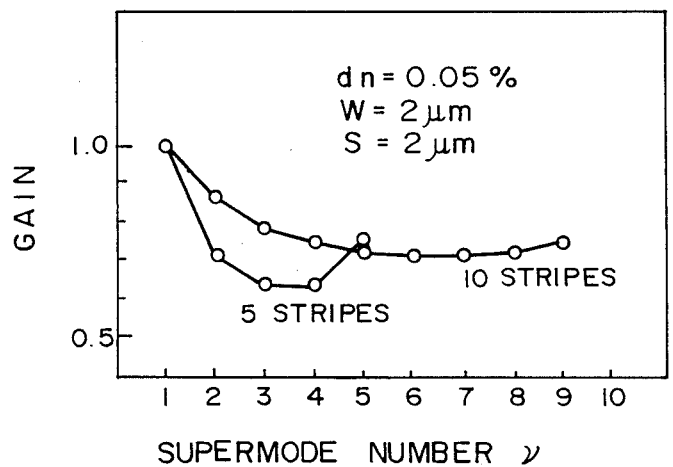

Referring to FIG. 6, an alternative embodiment of the integrated laser in accordance with the present invention is shown. FIGS. 7A through 7C are sections demonstrating a sequence of steps for fabricating the laser shown in FIG. 6. This embodiment is distinguishable over the embodiment of FIG. 1 in, among the others, the following respect. Specifically, a pair of layers 2a and 2b are formed one above the other on the current blocking layer 2. The layers 2a and 2b are respectively an n-type $Al_xGa_{1-x}As$ antimeltback layer and an n-type GaAs meltback layer. The other layers sequentially laminated in this embodiment and identical with those of the FIG. 1 embodiment are designated by the same reference numerals, and redundance description will be avoided for simplicity.

In the illustrative embodiment, as in the previous embodiment, the semiconductor laser was designed to lase with a wavelength of 830 nanometers and to have a stripe width W of 4 microns and a stripe pitch of 5 microns, i.e., W=4 microns and S=1 micron. Under such dimensional conditions and assuming five stripes, whether or not the laser having the structure shown in FIG. 6 is achievable depends on the thickness of the meltback layer 2b and the conditions for the liquid-phase epitaxial growth of the lower cladding layer 3 and waveguide layer 4.

A procedure for fabricating the integrated laser shown in FIG. 6 will be described with reference to FIGS. 7A, 7B and 7C. As shown in FIG. 7A, a p-type GaAs substrate 1 is prepared. Then, an n-type GaAs current blocking layer 2, an n-type $Al_xGa_{1-x}As$ antimeltback layer 2a and an n-type GaAs meltback layer 2b are sequentially grown by either liquid-phase epitaxial growth of gas-phase epitaxial growth. Specifically, either one of liquid-phase growth and gas-phase growth may be selected in matching relation to the design conditions such as the thicknesses of such layers.

The current blocking layer 2, antimeltback layer 2a and meltback layer 2b are assumed to be 0.5 micron to 0.8 micron, 0.2 micron, and 0.1 micron to 0.3 micron, respectively. Let the crystalline mixture ratio x of the antimeltback layer 2a be 0.1 to 0.2. It is to be noted than the crystalline mixture ratio x is determined by the function of the antimeltback layer 2a of preventing the oxidation of bare surfaces and preventing the meltback.

Next, as shown in FIG. 7B, stripe-like channels 11 are formed by photolithographic etching technology so as to locally uncover the substrate 1. This is followed by melting back the portions of the meltback layer 2b each intervening between nearby channels 11, by using a solution which is adapted to grow a p-type $Al_{0.4}Ga_{0.6}As$ lower cladding layer 3. Subsequently, as shown in FIG. 7C, the lower cladding layer 3 is grown on the laminate. A p-type $Al_{0.33}Ga_{0.67}As$ waveguide layer 4 is grown on the lower cladding layer 3.

For the above growing procedure, there may be selected a growth temperature of 800 degrees centigrade, a solution having a supersaturation degree of 2 degrees to 3 degrees centrigade, and a supercooling method which uses a cooling speed of 0.5 degree centigrade per minute.

The method discussed above with reference to FIGS. 7A to 7C can be implemented with a solution having a lower supersaturation degree, compared to the method of the first embodiment which grows the channels 11 by adjusting the supersaturation degree. This is because the meltback layer 2b eliminates the bite into the ridges intervening between nearby channels, i.e., it prevents nearby ridges from being melt back.

The growth proceeds at a high rate in the recesses and at a low rate in the flat portions, the angles are easy to melt back, and AlGaAs is not easy to melt back. Hence, when the above-mentioned supersaturation degree is selected, in an initial stage of growth, the recesses or bottoms of the channels 11 grow, the portions of the meltback layer 2b intervening between nearby stripes 11 are melt back, and the meltback terminates at the antimeltback layer 2a. This allows the waveguide layer 4 to be grown on the lower cladding layer 3 so that an active layer 5 may be formed flat on the layer 4. Advantageously, the supersaturation degree for growing the waveguide layer 4 is 1 degrees to 3 degrees centigrade.

The growth of the lower cladding layer 3 is followed by the sequential growth of a p-type $Al_{0.33}Ga_{0.67}As$ waveguide layer 4, an $Al_{0.08}Ga_{0.92}As$ active layer, an n-type $Al_{0.5}Ga_{0.5}As$ reflecting layer 6, an n-type $Al_{0.35}Ga_{0.65}As$ upper cladding layer 7, and an n-type GaAs cap layer 8. The resulting laminate structure is shown in FIG. 7C. Subsequently, as shown in FIG. 6, an n-side and a p-side ohmic electrode 9 and 10, respectively, are formed on the upper surface of the cap layer 8 and the lower surface of the substrate 1, respectively, completing the integrated semiconductor laser.

As stated above, in the illustrative embodiment, the meltback layer 2b is 0.2 micron to 0.3 micron thick so that the thicknesses $t_1$, $t_2$ and $t_3$ of the waveguide layer 4 are 1 micron to 0.7 micron, 0.6 micron, and 0.4 micron, respectively. The effective refractive index differences $dn_1$ and $dn_2$ under the above conditions is 0.1 percent or less and 0.2 percent to 0.3 percent, respectively. More specifically, the effective refractive index can be made smaller in the opposite marginal potions than the interchannel portions by 0.1 percent to 0.2 percent. This is also successful in achieving the effective refractive index distribution shown in FIG. 3.

While the illustrative embodiments shown and described implement the substrate as a GaAs substrate, they are advantageously practicable even with a substrate made of any other III–V semiconductor such as In-P.

In summary, in accordance with the present invention, an integrated laser has opposite marginal regions whose equivalent refractive index is smaller by 0.1 percent to than the equivalent refractive index of a group of stripe-like channels, which are interposed between the marginal regions, that of interchannel regions each intervening between nearby stripe channels. Such a laser achieves a greater difference in gain between the fundamental supermode and higher harmonic supermodes within the range of design dimensions that can be readily implemented by liquid-phase epitaxial growth, offering a desirable single-peak far-field image.

The integrated laser of the present invention is composed of a substrate having stripe-like channels, and a lower cladding layer, a waveguide layer, an active layer, a reflecting layer, an upper cladding layer and a cap layer which are sequentially deposited on the substrate by liquid-phase epitaxial growth. During the formation of the lower cladding layer, the channels and the interchannel regions are melt back to provide the waveguide layer with a thickness distribution which is sequentially reduced in the order of channel regions, interchannel regions and marginal regions. Hence, a structure which satisfies the condition stated above is achieved with ease.

The laser, therefore, can have channels or stripes each having a substantial width which contributes to the increase in the difference in gain between the fundamental supermode and higher harmonic supermodes, insuring single-peak large output.

Further, a current blocking layer, an antimeltback layer and a meltback layer are sequentially grown on the substrate. The thickness of the meltback layer is selectable within the range of 0.1 micron to 0.3 micron so that the thickness if the waveguide layer can be controlled. This allows the lower cladding layer to be grown without the need for a noticeable change in the supersaturation degree of a solution to be used for the growth, even if the number of channels is increased. Such a laser attains a uniform waveguide configuration, i.e., it is free from the drawback particular to the prior that the amount of meltback sequentially increases toward the intermediate region. The supersaturation degree of the solution is small enough to minimize the occurrence that the channels are filled up, guaranteeing the desired effective refractive index difference. In addition, the device characteristics are noticeably improved because cores are rarely formed in the solution.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. In an integrated phase-locked semiconductor laser wherein a plurality of waveguide paths extend in parallel to each other, the improvement comprising:
  a semiconductor substrate having opposite major surfaces;

a current blocking layer formed on one of the opposite major surfaces, and divided into a plurality of interchannel regions by a plurality of stripe-like channels, each of which has a bottom reaching at least the one major surface, said current blocking layer having opposite side regions which are thicker than the plurality of interchannel regions;

a first cladding layer covering a surface of said current blocking layer and the bottoms of the channels;

a waveguide layer formed on said first cladding layer and having a substantially flat surface which is opposite to said first cladding layer;

an active layer formed on the surface of said waveguide layer;

a light-reflecting layer formed on said active layer;

a second cladding layer formed on said light-reflecting layer; and a cap layer formed on said second second cladding layer;

whereby said waveguide layer has an effective refractive index profile which sequentially decreases in the order of first regions corresponding to the plurality of channels, second regions corresponding to the plurality of interchannel regions and third regions corresponding to the opposite side regions.

2. A laser in accordance with claim 1, wherein said waveguide layer has a thickness which sequentially decreases in the order of the first regions, the second regions, and the third regions relatively to each other.

3. A laser in accordance with claim 1, wherein said current blocking layer has a generally uniform thickness;

said laser further comprising:

an antimeltback layer formed on said current blocking layer; and a meltback layer formed on regions of said antimeltback layer which correspond to the third regions;

said first cladding layer being formed on said meltback layer and regions of said antimeltback layer which correspond to the first and second regions.

4. A laser in accordance with claim 1, further comprising:

a first ohmic electrode formed on the other major surface of said semiconductor substrate; and a second ohmic electrode formed on said cap layer.

5. A laser in accordance with claim 1, wherein said semiconductor substrate comprises p-type GaAs;

said current blocking layer comprising n-type GaAs;

said first cladding layer comprising p-type $Al_{0.4}Ga_{0.6}As$;

said waveguide layer comprising p-type $Al_{0.33}Ga_{0.67}As$;

said active layer comprising $Al_{0.08}Ga_{0.92}As$;

said reflecting layer comprising n-type $Al_{0.5}Ga_{0.5}As$;

said second cladding layer comprising n-type $Al_{0.35}Ga_{0.65}As$;

said cap layer comprising n-type GaAs.

6. A laser in accordance with claim 3, wherein said semiconductor substrate comprises GaAs;

said current blocking layer comprising n-type GaAs;

said first cladding layer comprising p-type $Al_{0.4}Ga_{0.6}As$;

said waveguide layer comprising p-type $Al_{0.33}Ga_{0.67}As$;

said active layer comprising $Al_{0.08}Ga_{0.92}As$;

said reflecting layer comprising n-type $Al_{0.5}Ga_{0.5}As$;

said second cladding layer comprising n-type $Al_{0.35}Ga_{0.65}As$;

said cap layer comprising n-type GaAs;

said antimeltback layer comprising $Al_xGa_{1-x}As$;

said meltback layer comprising GaAs, x being a value lying in a range of 0.1 to 0.2.

* * * * *